United States Patent
Schepis et al.

(10) Patent No.: US 9,634,142 B1
(45) Date of Patent: Apr. 25, 2017

(54) METHOD FOR IMPROVING BORON DIFFUSION IN A GERMANIUM-RICH FIN THROUGH GERMANIUM CONCENTRATION REDUCTION IN FIN S/D REGIONS BY THERMAL MIXING

(71) Applicant: GLOBALFOUNDRIES INC., Grand Cayman (KY)

(72) Inventors: Dominic J. Schepis, Wappingers Falls, NY (US); Alexander Reznicek, Troy, NY (US); Pouya Hashemi, White Plains, NY (US); Kangguo Cheng, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/076,699

(22) Filed: Mar. 22, 2016

(51) Int. Cl.
*H01L 21/324* (2006.01)
*H01L 21/02* (2006.01)
*H01L 29/78* (2006.01)
*H01L 29/66* (2006.01)
*H01L 29/417* (2006.01)

(52) U.S. Cl.
CPC ........ *H01L 29/7848* (2013.01); *H01L 21/324* (2013.01); *H01L 29/41791* (2013.01); *H01L 29/66545* (2013.01); *H01L 29/66553* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,558,279 B2 | 10/2013 | Cea et al. | |
| 8,895,395 B1* | 11/2014 | Kerber | H01L 29/66795 438/153 |
| 9,240,454 B1* | 1/2016 | Liu | H01L 21/02529 |
| 2008/0001171 A1* | 1/2008 | Tezuka | H01L 21/823807 257/191 |
| 2011/0012090 A1 | 1/2011 | Singh et al. | |
| 2011/0263104 A1* | 10/2011 | Adam | H01L 29/66628 438/479 |

(Continued)

*Primary Examiner* — Marc Armand
*Assistant Examiner* — Younes Boulghassoul
(74) *Attorney, Agent, or Firm* — Yuanmin Cai; Hoffman Warnick LLC

(57) ABSTRACT

A method may include forming a germanium-including fin on a substrate, and forming a dummy gate extending over the germanium-including fin, creating a channel under the gate and a source/drain region of the germanium-including fin extending from under the dummy gate on each side of the dummy gate. An in-situ p-type doped silicon germanium layer may be grown over the source/drain region, the germanium-including fin having a higher concentration of germanium than the in-situ p-type doped silicon germanium layer. An anneal thermally mixes the germanium of the in-situ p-type doped silicon germanium layer and the germanium of the germanium-including fin in the source/drain region of the germanium-including fin and diffuses the p-type dopant of the in-situ p-type doped silicon germanium layer into the channel of the germanium-including fin, forming a source/drain extension. A portion of the channel has a higher germanium concentration than the source/drain region.

14 Claims, 5 Drawing Sheets

(56) References Cited

U.S. PATENT DOCUMENTS

| | | |
|---|---|---|
| 2014/0167163 A1 | 6/2014 | Cheng et al. |
| 2015/0060945 A1 | 3/2015 | Murthy et al. |
| 2015/0270349 A1* | 9/2015 | Cheng .................. H01L 29/161 257/9 |
| 2016/0087070 A1* | 3/2016 | Machkaoutsan .... H01L 29/6681 257/192 |

\* cited by examiner

METHOD FOR IMPROVING BORON DIFFUSION IN A GERMANIUM-RICH FIN THROUGH GERMANIUM CONCENTRATION REDUCTION IN FIN S/D REGIONS BY THERMAL MIXING

BACKGROUND OF THE INVENTION

The disclosure relates generally to forming FinFETs, and more particularly, to a p-type FinFET and method of forming a source/drain extension region therefor in a high percentage germanium-including fin.

Integrated circuit (IC) formation continues to occur at ever smaller dimensions. Current technology is focused on the 10 nanometer technology node. One challenge for the 10 nanometer technology node and beyond is presented by material changes in the semiconductor structures used to make the ICs. For example, advanced technology nodes are turning to different materials for fins that are used to form fin-type field effect transistors (FinFETs). FinFETs use relatively tall, thin semiconductor fins to form the requisite parts of the FET. For example, with FinFETs, a gate is formed over a semiconductor fin to create a channel thereunder in the fin, and doped source/drain (S/D) regions are provided by doping portions of the semiconductor fin that extend from sides of the gate. S/D regions may have doped extensions that extend into the channel under the gate. The form of dopants used depends on the type of FinFET desired: n-type or p-type. N-type elements introduced to a semiconductor generate free electrons (by "donating" electron to semiconductor), and P-type elements introduced to a semiconductor generate free holes (by "accepting" electron from semiconductor atom and "releasing" hole at the same time). P-type FETs operate on a depletion-mode in which a positive charge from a gate forces positively charged holes away from the gate-insulator/semiconductor contact area (depleting area), leaving exposed a carrier-free area of negatively charged, immobile, acceptor ions.

For p-type FinFETs, current technology nodes and beyond are using high percentage germanium-including fins such as relaxed (not strained) silicon germanium (SiGe) having 75% or greater germanium (Ge) content—up to pure Ge (i.e., 100% Ge). For pFinFETs, typically the higher the germanium percentage in the channel of the germanium-including fin, the better the performance in terms of hole mobility, compared to silicon alone. One challenge with this material is that junction formation in pFinFETS (i.e., formation S/D region extensions into a channel under the gate) is accomplished by out-diffusion of p-dopant (commonly boron) from a source/drain merge epitaxy layer provided over the source/drain region of the fin and into the channel under a spacer of the gate. The more abrupt the junction between the channel of the germanium-including fin and the source/drain region (and extension), the better the performance. Ion implantation has been used in earlier technology nodes to implant boron into the epitaxy layer, which is then followed by annealing to diffuse the boron. However, ion implantation is becoming impractical due to the tight dimensions and the three-dimensional structures of advancing FinFET architecture. More troubling, boron diffusion is significantly reduced the higher the germanium content of the germanium-including fins—practically no diffusion of boron occurs in pure germanium. Consequently, obtaining the best performance becomes a tradeoff between high germanium content in the channel and better boron diffusion for the source/drain regions.

BRIEF DESCRIPTION OF THE INVENTION

A first aspect of the disclosure provides a method comprising: forming a germanium-including fin on a substrate; forming a dummy gate extending over the germanium-including fin, creating a channel under the dummy gate and a source/drain region of the germanium-including fin extending from under the dummy gate on each side of the dummy gate; growing an in-situ p-type doped silicon germanium layer over the source/drain region, the germanium-including fin having a higher concentration of germanium than the in-situ p-type doped silicon germanium layer; and annealing to thermally mix the germanium of the in-situ p-type doped silicon germanium layer and the germanium of the germanium-including fin in the source/drain region of the germanium-including fin and diffuse the p-type dopant of the in-situ p-type doped silicon germanium layer into the source/drain region of the germanium-including fin.

A second aspect of the disclosure provides a method comprising: forming a silicon germanium fin on a substrate; forming a dummy gate extending over the silicon germanium fin, creating a channel under the dummy gate and a source/drain region of the silicon germanium fin extending from under the dummy gate on each side of the dummy gate; growing an in-situ boron-doped silicon germanium layer over the source/drain region, the silicon germanium fin having a higher concentration of germanium than the in-situ boron-doped silicon germanium layer; and annealing to thermally mix the germanium of the in-situ boron-doped silicon germanium layer with the germanium of the silicon germanium fin in the source/drain region of the silicon germanium fin and diffuse the boron into the source/drain region of the silicon germanium fin, forming a source/drain extension adjacent to the channel. After the annealing, a portion of a channel of the silicon germanium fin under the dummy gate has a higher concentration of germanium than the source/drain region of the silicon germanium fin.

A third aspect of the disclosure provides a p-type fin field effect transistor (p-FinFET), comprising: a germanium-including fin on a substrate; and a gate extending perpendicularly over the germanium-including fin, creating a channel under the gate in the germanium-including fin and a source/drain region of the germanium-including fin extending from under the gate on each side of the gate, wherein the source/drain region of the germanium-including fin includes a p-type dopant therein, and a portion of the channel under the gate has a higher concentration of germanium than germanium content of the source/drain region of the germanium-including fin.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

As indicated above, the disclosure provides a p-type FinFET and method of forming a source/drain extension region therefor in a high percentage germanium-including fin.

In the following specification and the claims, reference will be made to a number of terms, which shall be defined to have the following meanings: "Optional" or "optionally" means that the subsequently described event or circumstance may or may not occur, and that the description includes instances where the event occurs and instances where it does not. Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value; otherwise, "approximately" as used herein may indicate +/−10% of the stated value(s). Here and throughout the specification and claims, range limitations may be combined and/or interchanged, such ranges are identified and include all the sub-ranges contained therein unless context or language indicates otherwise.

Figure 1:
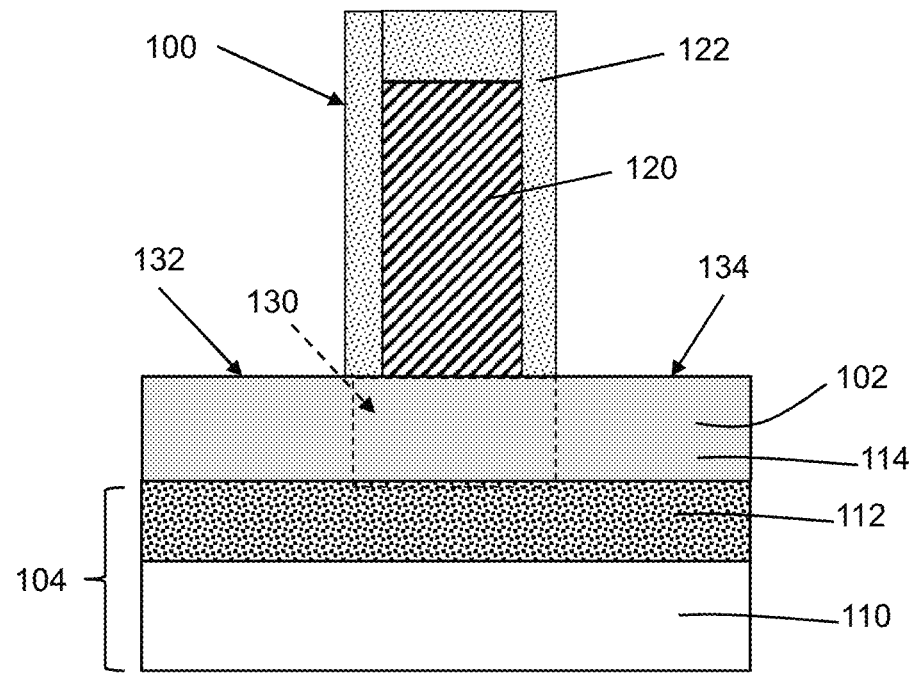
FIG. 1 shows a cross-sectional view through a dummy gate for a FinFET and showing steps of a method according to embodiments of the disclosure.
Figure 2:
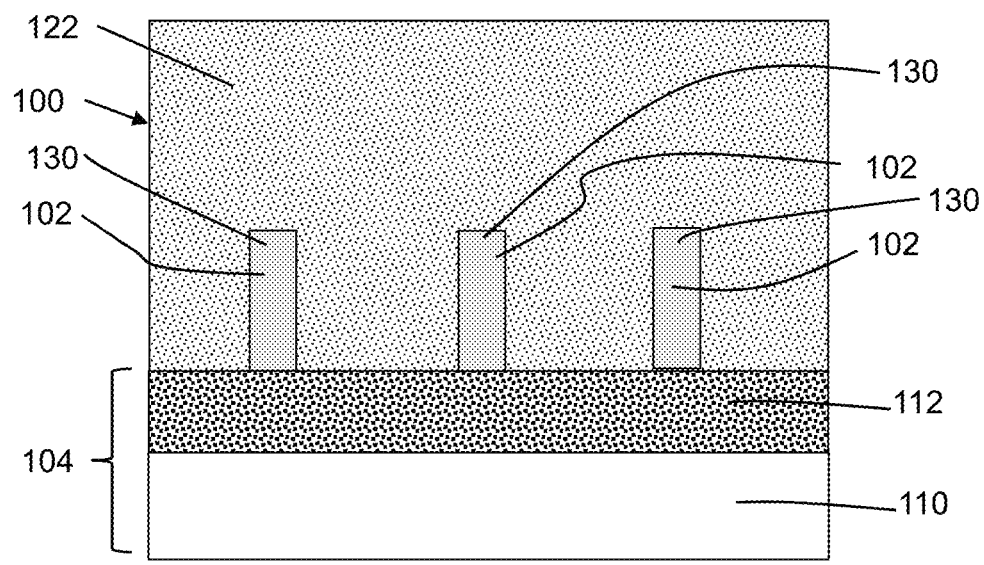
FIG. 2 shows a cross-sectional view through a number of fins for the FinFET and showing steps of a method according to embodiments of the disclosure.

FIG. 1 shows a cross-sectional view through a dummy gate 100 for a FinFET, and FIG. 2 shows a cross-sectional view through a number of fins 102 for the FinFET. FIGS. 1 and 2 show forming a germanium-including fin 102 on a substrate 104. As shown in FIG. 2, typically a plurality of fins 102 are formed simultaneously. Substrate 104 is shown as a semiconductor-on-insulator (SOI) substrate including a (bulk) semiconductor layer 110 and a buried insulator layer 112 thereover. Fins 102 are formed in a germanium-including SOI layer 114 (FIG. 1) over buried insulator layer 112. SOI devices differ from conventional silicon-built devices in that the silicon junction is above buried insulator layer 112. The precise thickness of buried insulating layer 112 and germanium-including SOI layer 114, and hence germanium-including fins 102, vary widely with the intended application.

Each layer 110, 112, 114 may be formed using any now known or later developed technique such as sequential deposition of material. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), reaction processing CVD (RP-CVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Semiconductor layer 110 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor layer 110 may be strained. Buried insulator 112 may include, for example, silicon dioxide or (less commonly) sapphire. The choice of insulator depends largely on intended application, with sapphire being used for radiation-sensitive applications and silicon oxide preferred for improved performance and diminished short channel effects in microelectronics devices. Germanium-including SOI layer 114 and thus germanium-including fins 102 may include any germanium-including semiconductor material including but not limited to silicon germanium (SiGe), or pure germanium (i.e., 100% germanium). In one embodiment, regardless of germanium content, SOI layer 114, and hence fins 102, are relaxed, i.e., they are not strained. Where SiGe is employed, in accordance with embodiments of the disclosure, the germanium content is preferably relatively high, e.g., 75-95%, so that a channel 130 (shown with phantom box in FIGS. 1, 3, 5, 7 and 9) of an eventual active gate 182 (FIG. 9) includes a high concentration of germanium to optimize hole mobility performance of the p-type FinFET. As used herein, the germanium content is stated in terms of atomic weight percentage measured, e.g., by conventional XPS or SIMS techniques.

Germanium-including fins 102 may be formed from germanium-including SOI layer 114 using any now known or later developed photolithographic technique, e.g., depositing a mask (not shown), patterning the mask, etching the mask and etching layer 114 to form fins 102 (e.g., reactive ion etching (RIE)). "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. As shown best in FIG. 2, the fin formation typically results in a number of spaced fins 102 atop buried insulator layer 112.

Figure 3:
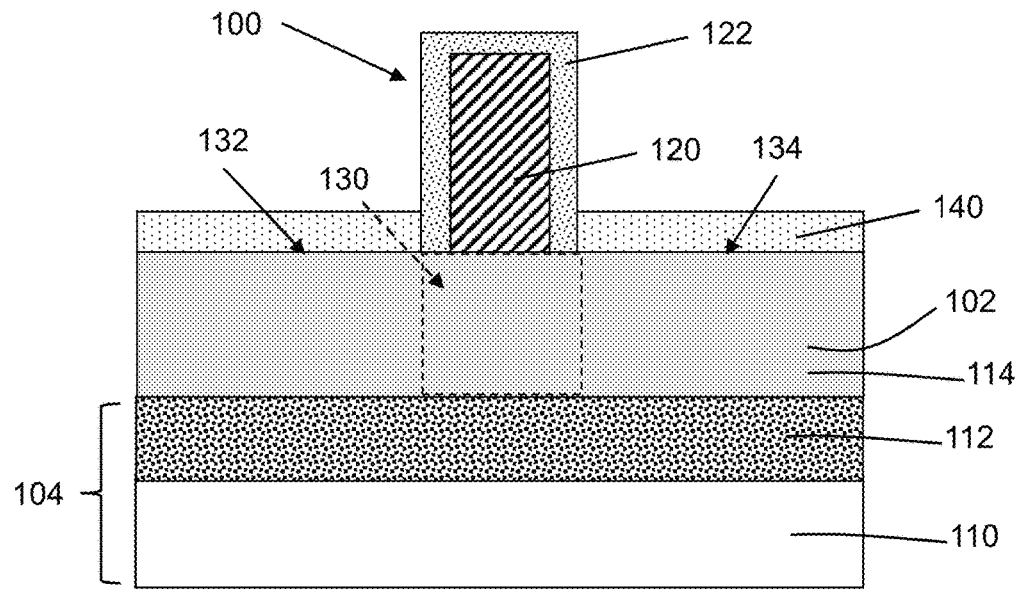
FIG. 3 shows a cross-sectional view through a dummy gate for a FinFET and showing steps of a method according to embodiments of the disclosure.
Figure 4:
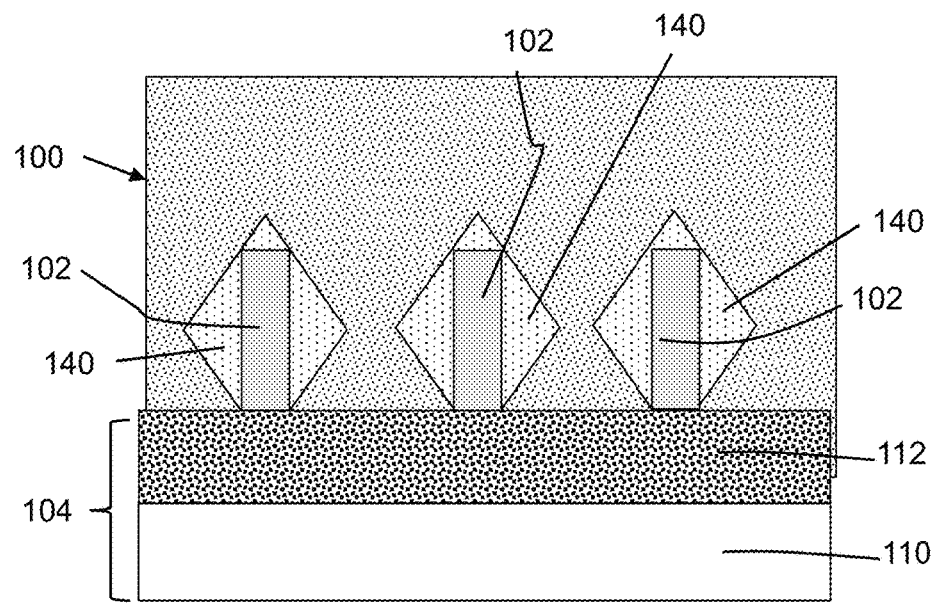
FIG. 4 shows a cross-sectional view through a number of fins for the FinFET and showing steps of a method according to embodiments of the disclosure.

FIGS. 1 and 2 also show forming a dummy gate 100 extending over germanium-including fin(s) 102. Dummy gate 100 may include a gate body 120 and a spacer 122 at sidewalls of gate body 120. As understood, gate body 120 includes a material such as polysilicon that is placed where an active, metal or doped polysilicon gate will eventually be placed so that processing that would be harmful to the active gate can be carried out. Spacer 122 may include a hard mask material such as silicon nitride ($Si_3N_4$) to assist in protecting gate body 120 and control further processing. As understood, dummy gate 100 (and eventually an active gate 182 (FIG. 9) that replaces it) creates channel 130 under the dummy gate, near top of the fin (shown by phantom box in FIGS. 1, 3, 5, 7 and 9). Further, a (to-be-formed) source/drain region 132, 134 (FIG. 1) of germanium-including fin 102 extend from under dummy gate 100 on each side of the dummy gate. Gate body 120 may be formed by depositing dummy gate material and patterning using any now known or later developed photolithography technique. Spacer material such as silicon nitride may be deposited and then etched to leave spacer 122 over gate body 120. FIGS. 3 and 4 show a cross-sectional view through dummy gate 100 and a cross-sectional view through germanium-including fins 102, respectively, after growing an in-situ p-typed doped silicon germanium (SiGe) layer 140 over source/drain region 132, 134. P-typed doped SiGe layer 140 may be grown using epitaxy in a RPCVD epitaxy reactor at a temperature between, for example, approximately 580-620° C. (e.g., approximately 600° C.). The terms "growing," "epitaxial growth" and "epitaxially formed and/or grown" mean the growth of a semiconductor material on a deposition surface of a semiconductor material (fins 102), in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. As illustrated in FIG. 4, due to the above nature of epitaxy, SiGe layer 140 generally forms in a diamond shape on germanium-including fins 102. As epitaxial growth processes are selective to forming on semiconductor surfaces (e.g., fins 102), no deposition occurs on the dielectric (e.g., silicon nitride) of spacer 122. As understood, as the epitaxy occurs, a p-type dopant may be introduced such that SiGe layer 140 is in-situ doped, i.e., doped in-place as it is formed. In-situ doped SiGe layers are usually grown, for example, with silane ($SiH_4$) and germane ($GeH_4$) as the dopant source. Adjusting, for example, a germane flow may provide a p-type dopant concentration range of about $5E20$ $cm^{-3}$ to $1.5E21$ $cm^{-3}$. In one particular example, a p-type dopant concentration may be approximately $1E21$ $cm^{-3}$.

Figure 5:
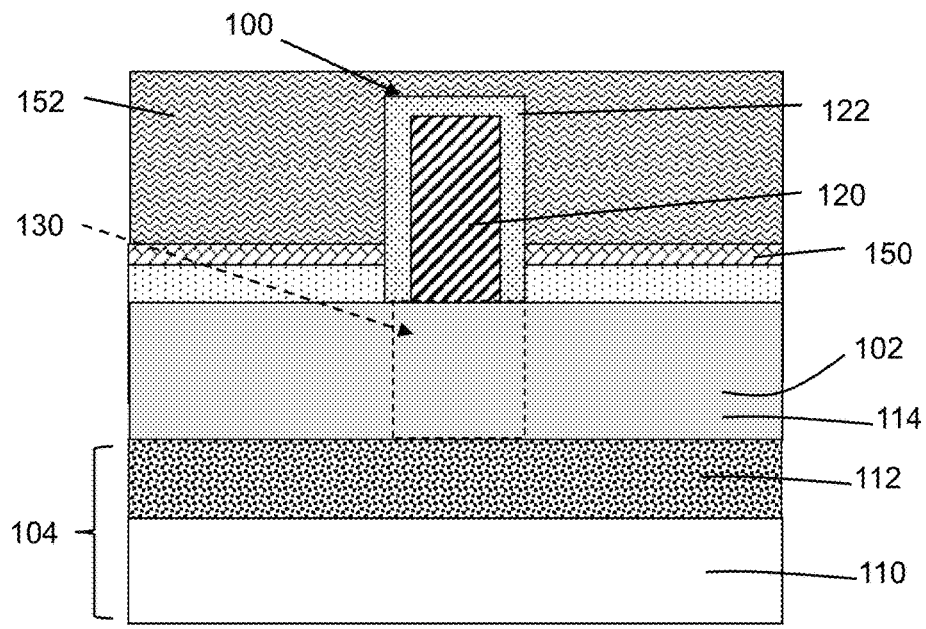
FIG. 5 shows a cross-sectional view through a dummy gate for a FinFET and showing steps of a method according to embodiments of the disclosure.
Figure 6:
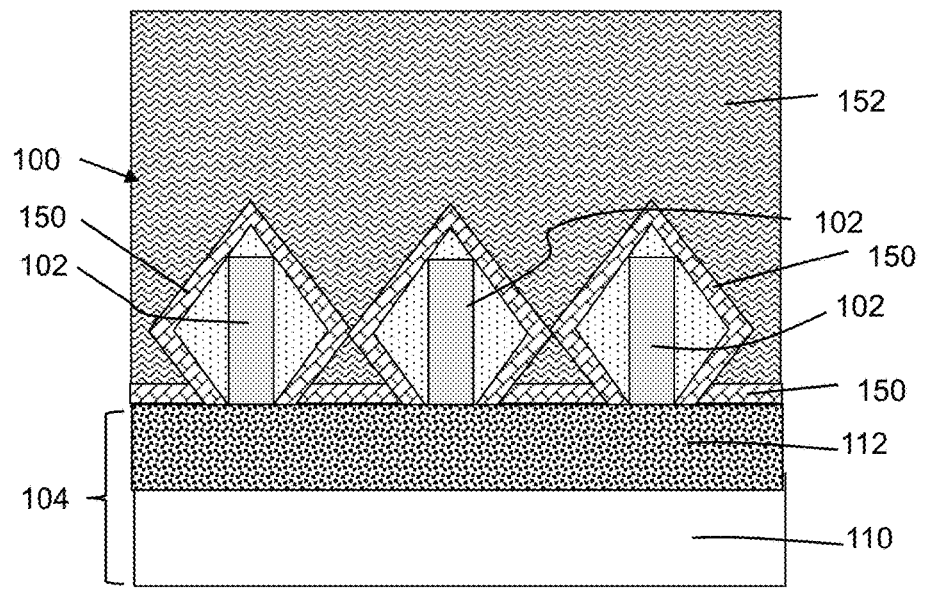
FIG. 6 shows a cross-sectional view through a number of fins for the FinFET and showing steps of a method according to embodiments of the disclosure.

In accordance with embodiments of the disclosure, boron (B) has been used as the p-type dopant. It is possible, however, that other p-type dopants may be employed, such as but not limited to: indium (In) and gallium (Ga). In any event, in accordance with embodiments of the disclosure, germanium-including fins 102 have a higher concentration of germanium than in-situ p-type doped silicon germanium layer 140. As noted herein, germanium-including fins 102 typically have a high concentration of germanium, e.g., 75-95%. In accordance with embodiments of the disclosure, in-situ p-type doped SiGe layer 140 may include approximately 30-50% germanium, and in one example approximately 35%. The percentage germanium in in-situ p-type doped SiGe layer 140 may be tailored to achieve the desired germanium content for source/drain region 132, 134 upon thermal mixing with p-type dopant in source/drain region 132, 134, as will be described herein. For example, prior to annealing as will be described herein, germanium-including fin 102, i.e., source/drain region 132, 134, may include greater than approximately 75% germanium and in-situ p-type (e.g., boron) doped SiGe layer 140 may include approximately 35% germanium. In-situ p-type doped SiGe layer 140 may have any thickness sufficient to provide the source of germanium (or silicon) to achieve the desired germanium content after thermal mixing by annealing, as will be described herein. In one example, SiGe layer 140 may have a thickness of approximately 200-1000 nanometers In FIGS. 5 and 6, a cross-sectional view through dummy gate 100 and a cross-sectional view through germanium-including fins 102, respectively, are shown. FIGS. 5 and 6 show optional steps of forming a conformal liner 150 over source/drain region 132, 134 of germanium-including fin 102, and forming a dielectric layer 152 over conformal liner 150. As shown in FIG. 6, conformal liner 150 covers in-situ p-type doped SiGe layer 140 and buried insulator layer 112 between dummy gates 100. Conformal liner 150 may include any now known or later developed liner material such as but not limited to silicon oxide ($SiO_2$) and/or silicon nitride ($Si_3N_4$). Conformal liner 150 may have a thickness of, for example, approximately 100-200 nanometers. Conformal liner 150 acts as a cap to prevent germanium diffusion outwards into the atmosphere during the thermal mixing process. Thus, conformal liner 150 ensures the germanium can only diffuse into source/drain regions 132, 134. Liner 150 can also act as an etch stopping layer when contacts are etched, as will be described herein. Dielectric layer 152 may include any now known or later developed interlayer dielectric material such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 7:
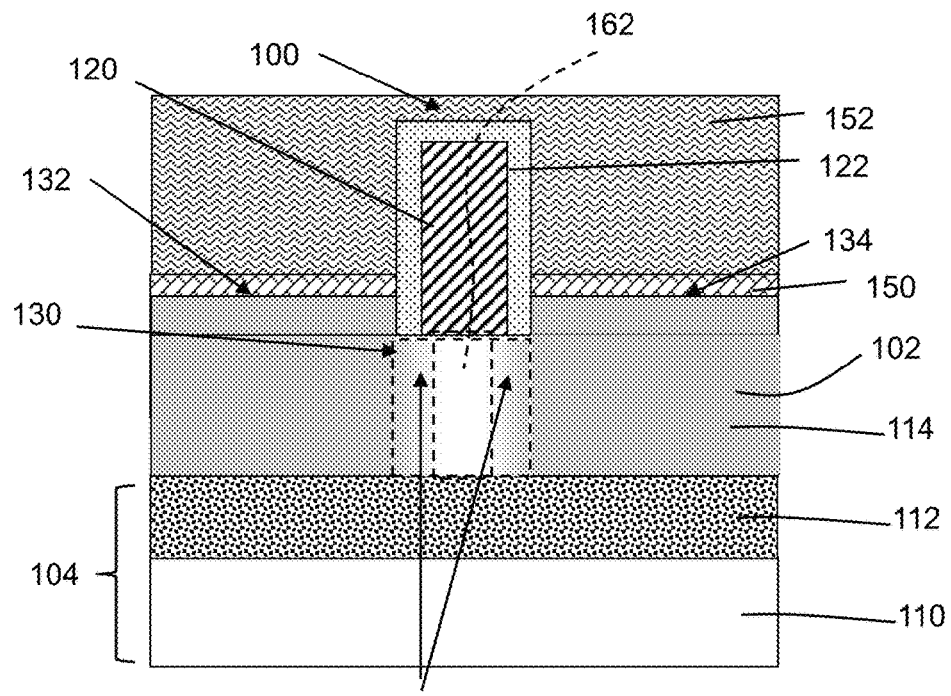
FIG. 7 shows a cross-sectional view through a dummy gate for a FinFET and showing steps of a method according to embodiments of the disclosure.
Figure 8:
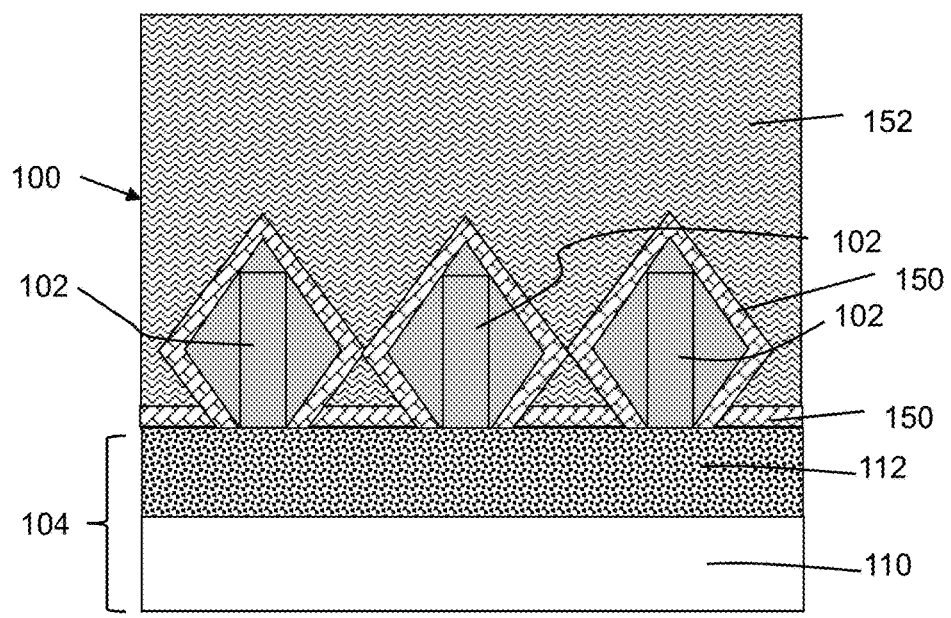
FIG. 8 shows a cross-sectional view through a number of fins for the FinFET and showing steps of a method according to embodiments of the disclosure.

FIGS. 7 and 8 show a cross-sectional view through dummy gate 100 and a cross-sectional view through germanium-including fins 102, respectively, after an annealing process. The annealing can be carried out using any now known or later developed thermal process. In one example, the annealing may occur in an inert atmosphere, e.g., of helium (He), argon (Ar) and/or neon (Ne), at a temperature of approximately 800-1350° C. The annealing can occur in a conventional anneal furnace and have a duration of approximately 1 hour at higher temperature ranges (e.g., approximately 1000-1200° C.), or it could occur in a rapid thermal anneal furnace at a higher temperature for a shorter period of time.

Regardless of the anneal technique used, in accordance with embodiments of the disclosure, the annealing thermally mixes the germanium of in-situ p-type doped SiGe layer 140 and the germanium of germanium-including fin 102 in source/drain region 132, 134 (FIG. 7) of germanium-including fin 102. That is, germanium out-diffuses from source/drain region 132, 134 to SiGe layer 140. As indicated by the shading change in FIGS. 7 and 8 compared to FIGS. 5 and 6, the thermal mixing causes the germanium content throughout source/drain region 132, 134 substantially uniform, e.g., within approximately +/–0-3%. As indicated in how source/drain region 132, 134 extends adjacent to a lower portion of sides of dummy gate 100, a thickness of source/drain region 132, 134 may be increased from conversion of in-situ p-type doped SiGe layer 140 (FIGS. 5 and 6) to the substantially same germanium content as germanium-including fin 102. As illustrated, germanium-including fin 102 include silicon-germanium such that there may not be an identifiable border between SiGe layer 140 and fins 102 that are also SiGe. As noted, germanium-including fins 102 need not include silicon. In this case, it will be understood that a border (although perhaps not well refined due to in-diffusion of silicon into the fins) may exist between SiGe layer 140 and fins 102 including pure germanium.

The annealing also diffuses the p-type dopant (e.g., boron) of in-situ p-type doped SiGe layer 140 into source/drain region 132, 134 of germanium-including fin 102, and channel 130. The diffusion of p-type dopant creates source/drain extensions 160 adjacent to channel 130. (See channel 130 as larger phantom box in FIG. 7 shown with darker shading similar to that of source/drain region 132, 134). As illustrated best in FIG. 7, the annealing also causes a portion 162 of channel 130 under dummy gate 100 (shown with smaller phantom box within larger phantom box and with lighter shading) including source/drain extension regions 160 to have a higher concentration of germanium than source/drain region 132, 134. For example, due to the use of in-situ SiGe layer 140 rather than ion implantation, after the annealing, portion 162 of channel 130 of germanium-including fin 102 under dummy gate 100 may include whatever higher concentration of germanium germanium-including fin 102 started with, e.g., ranging from approximately 75% to 95%, such as approximately 85% germanium. This higher germanium concentration within portion 162 and source/drain extensions 160 is in conformance with typically advantageous levels of germanium to optimize pFinFET performance, i.e., hole mobility. In addition, source/drain region 132, 134 of germanium-including fin 102 may include, for example, between approximately 50% and 70% germanium. The lower concentration of germanium in source/drain region 132, 134 caused by the out-diffusion of germanium from source/drain region 132, 134 to in-situ p-type doped SiGe layer 140 during annealing, acts to improve the p-type dopant diffusion from SiGe layer 140 by reducing the concentration of germanium, which typically hinders the diffusion. The higher concentration of germanium in portion 162 of channel 130, however, acts to limit p-type dopant diffusion therein, creating a sharp, source/drain extension 162 border within channel 130. Where germanium-including fins 102 includes a relaxed germanium-including material, the relaxed stated is maintained.

Figure 9:
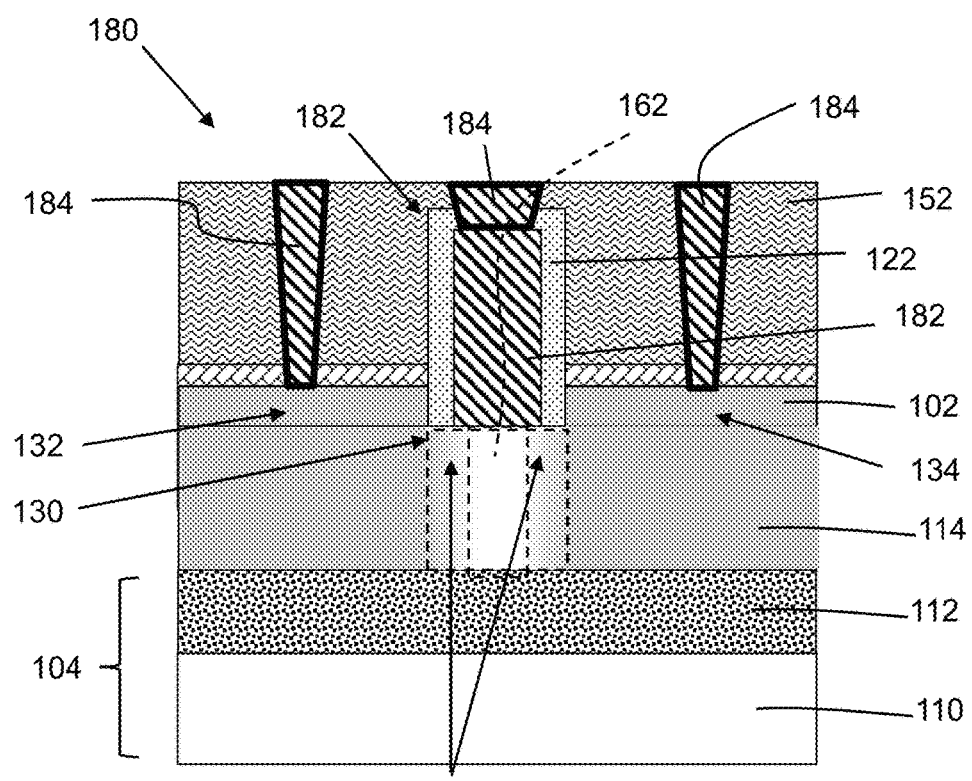
FIG. 9 shows a cross-sectional view a p-type FinFET through a gate thereof, and showing steps of a method according to embodiments of the disclosure.

FIG. 9 shows a cross-sectional view a p-type FinFET (pFinFET) 180 through a gate 182 thereof, and shows subsequent steps of a method according to embodiments of the disclosure. FIG. 9 shows pFinFET 180 after replacing dummy gate 100 (FIGS. 1-8) with an active gate 182. Active gate 182 may be formed using any now known or later developed replacement gate technique, e.g., etching dummy gate body 120 (FIG. 7) out from spacer 122, depositing a gate dielectric (not shown) in the open space, filling the open space with active gate material such as polysilicon (doped or undoped) or a metal such as copper, and planarizing. FIG. 9 also shows pFinFET 180 after forming contacts 184 to gate 182 and source/drain regions 132, 134 to form a p-type field effect transistor. Contacts 184 may be formed using any now known or later developed contact forming (e.g., self-aligning) technique, e.g., forming a mask, patterning the mask, etching to create openings in the mask, etching to create openings through dielectric layer 152, forming a silicide over source/drain region 132, 134, depositing a liner (dark outer line), depositing a contact metal such as copper and planarizing. As understood, contact 184 to gate 182 and contacts 184 to source/drain regions 132, 134 may be formed using different masks. According to embodiments of the disclosure, p-FinFET 180 may include germanium-including fin 102 on substrate 104. Gate 182 may extend perpendicularly over germanium-including fin 102, creating channel 130 under the gate in germanium-including fin 102 and a source/drain region 132, 134 of germanium-including fin 102 extending from under gate 182 on each side of the gate. Source/drain region 132, 134 of germanium-including fin 102 includes a p-type dopant (e.g., boron) therein, and portion 162 of channel 130 under gate 182 has a higher concentration of germanium than source/drain region 132, 134 of germanium-including fin 102. As noted herein, in one embodiment, portion 162 of channel 130 may include a relaxed silicon germanium having greater than approximately 75% germanium content, e.g., approximately 85%. In another embodiment, portion 162 of channel 130 may include, for example, approximately 85% germanium, and source/drain region 132, 134 of the germanium-including fin may include approximately 60% germanium. As noted herein, the initial germanium content of in-situ doped SiGe layer 140 and/or the initial germanium content of germanium-including fins 102 can be tailored to provide the desired germanium content of source/drain region 132, 134 after thermal mixing caused by the annealing. pFinFET 180 also may include portion 162 of channel 130 under gate 182 having a higher concentration of germanium than source/drain extension region 132, 134, which is in contrast to conventionally formed pFinFETs using ion implantation of the p-type dopant.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   forming a germanium-including fin on a substrate;
   forming a dummy gate extending over the germanium-including fin, creating a channel under the dummy gate and a source/drain region of the germanium-including fin extending from under the dummy gate on each side of the dummy gate;
   growing an in-situ p-type doped silicon germanium layer over the source/drain region of the germanium-including fin, the germanium-including fin having a higher concentration of germanium than the in-situ p-type doped silicon germanium layer; and
   annealing to thermally mix the germanium of the in-situ p-type doped silicon germanium layer and the germanium of the germanium-including fin in the source/drain region of the germanium-including fin and diffuse the p-type dopant of the in-situ p-type doped silicon germanium layer into the source/drain region of the germanium-including fin.

2. The method of claim 1, wherein annealing to thermally mix comprises causing a portion of the channel of the germanium-including fin under the dummy gate to have a higher concentration of germanium than the source/drain region of the germanium-including fin.

3. The method of claim 1, wherein, prior to annealing, the germanium-including fin includes between approximately 75% and 95% germanium and the in-situ p-type doped silicon germanium layer includes between approximately 30% and 50% germanium, by atomic weight.

4. The method of claim 3, wherein, after annealing, the channel includes a portion including approximately 85% germanium, and the source/drain region of the germanium-including fin includes approximately 60% germanium, by atomic weight.

5. The method of claim 1, wherein said annealing forms a source/drain extension region adjacent to the channel, the portion of the channel under the dummy gate having the higher concentration of germanium than the source/drain extension region.

6. The method of claim 1, wherein the substrate includes a buried insulator layer under the germanium-including fin and a semiconductor layer under the buried insulator layer, and
   wherein the dummy gate includes a gate body and a spacer at sidewalls of the gate body.

7. The method of claim 1, further comprising, prior to annealing:
   forming a conformal liner over the source/drain region of the germanium-including fin; and
   forming a dielectric layer over the conformal liner.

8. The method of claim 1, wherein the germanium-including fin includes pure germanium.

9. The method of claim 1, wherein the germanium-including fin includes a relaxed silicon germanium having greater than approximately 75% germanium, by atomic weight.

10. The method of claim 9, wherein the relaxed silicon germanium has approximately 85% germanium content, by atomic weight.

11. The method of claim 1, further comprising:
    replacing the dummy gate with an active gate; and
    forming contacts to the active gate and the source/drain regions to form a p-type field effect transistor.

12. A method comprising:
    forming a silicon germanium fin on a substrate;
    forming a dummy gate extending over the silicon germanium fin, creating a channel under the dummy gate and a source/drain region of the silicon germanium fin extending from under the dummy gate on each side of the dummy gate;
    growing an in-situ boron-doped silicon germanium layer over the source/drain region of the silicon germanium fin, the silicon germanium fin having a higher concentration of germanium than the in-situ boron-doped silicon germanium layer; and
    annealing to thermally mix the germanium of the in-situ boron-doped silicon germanium layer with the germanium of the silicon germanium fin in the source/drain region of the silicon germanium fin and diffuse the boron into the source/drain region of the silicon germanium fin, forming a source/drain extension adjacent to the channel,
    wherein, after the annealing, a portion of the channel of the silicon germanium fin under the dummy gate has a higher concentration of germanium than the source/drain region of the silicon germanium fin.

13. The method of claim 12, wherein, after annealing, the channel includes a portion including at least approximately 75% germanium, and the source/drain region of the silicon germanium fin includes at least approximately 60% germanium, by atomic weight.

14. The method of claim 12, further comprising, prior to annealing:
    forming a conformal liner over the source/drain region of the silicon germanium fin; and
    forming a dielectric layer over the conformal liner.

* * * * *